(12) United States Patent
Takahashi

(10) Patent No.: US 7,875,904 B2
(45) Date of Patent: Jan. 25, 2011

(54) PROTECTION CIRCUIT

(75) Inventor: Yukio Takahashi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/588,485

(22) Filed: Oct. 16, 2009

(65) Prior Publication Data
US 2010/0032714 A1 Feb. 11, 2010

Related U.S. Application Data

(62) Division of application No. 11/826,182, filed on Jul. 12, 2007, now Pat. No. 7,642,621.

(30) Foreign Application Priority Data

Jul. 13, 2006 (JP) ............................. 2000-193012

(51) Int. Cl.
*H01L 21/338* (2006.01)
(52) U.S. Cl. ................ 257/173; 257/197; 257/566; 438/170; 438/189
(58) Field of Classification Search ................ 257/173, 257/197, 565, 566; 438/170, 189, 202
See application file for complete search history.

(56) References Cited

U.S. PATENT DOCUMENTS

| | | | |
|---|---|---|---|
| 6,049,119 A | 4/2000 | Smith | |
| 6,323,523 B1 | 11/2001 | Lee et al. | |
| 6,555,878 B2* | 4/2003 | Song et al. | 257/355 |
| 7,291,888 B2* | 11/2007 | Huang | 257/361 |
| 7,570,027 B2* | 8/2009 | Teramoto et al. | 322/24 |
| 2008/0174924 A1 | 7/2008 | Kang et al. | |

FOREIGN PATENT DOCUMENTS

JP  2001-223277  8/2001

* cited by examiner

*Primary Examiner*—Phuc T Dang
(74) *Attorney, Agent, or Firm*—McGinn IP Law Group, PLLC

(57) ABSTRACT

In a protection circuit of an input/output terminal I/O, three types of PNP bipolar transistors are included. In a first PNP type bipolar transistor 10A, the emitter thereof is connected to the input/output terminal I/O, the base thereof is connected to a high-potential power supply terminal VDD, and the collector thereof is connected to a low-potential power supply terminal VSS. In a second PNP type bipolar transistor 10B, the emitter thereof is connected to the input/output terminal I/O, and the base and the collector thereof are connected to the high-potential power supply terminal VDD. In a third PNP type bipolar transistor 10C, the emitter thereof is connected to the low-potential power supply terminal VSS, and the base and the collector thereof are connected to the high-potential power supply terminal VDD.

2 Claims, 8 Drawing Sheets

PROTECTION CIRCUIT

The present Application is a Divisional Application of U.S. patent application Ser. No. 11/826,182, filed on Jul. 12, 2007 now U.S. Pat. No. 7,642,621.

BACKGROUND OF THE INVENTION

1. Field of the Invention

The present invention relates to a semiconductor device having an electrostatic discharge damage protection circuit, and the protection circuit.

2. Description of Related Art

In general, a MOS type semiconductor element in a semiconductor device has a disadvantage in that electrostatic discharge damage (ESD) easily occurs therein. ESD is a phenomenon that electric charges of electrified human bodies, machines, packages, and the like destroy the internal circuit of a semiconductor device, when they are discharged through the semiconductor device. In order to increase the resistance with respect to ESD, an electrostatic discharge damage protection circuit (electrostatic discharge damage protection element) is usually provided in the semiconductor device at the input terminal or the output terminal thereof (hereinafter, referred to as the "input/output terminal"). In such a semiconductor device, in order to achieve cost reduction, it is desired to achieve a minimal size electrostatic discharge damage protection circuit.

Conventional Example 1

Next, a known semiconductor device will be described with reference to drawings. FIG. 5 is an equivalent circuit diagram schematically showing an electrostatic discharge damage protection circuit of a semiconductor device according to Conventional Example 1. FIG. 6 (a) is a partial plan view schematically showing an electrostatic discharge damage protection circuit of the semiconductor device according to Conventional Example 1, and FIG. 6 (b) is a cross-sectional view between A and A'. In addition, Conventional Example 1 is an example related to Japanese Patent Laid-Open No. 2001-223277.

Referring to FIG. 5, the protection circuit of an input/output terminal 102 connected to an internal element is composed of a PNP type bipolar transistor 110. In the PNP type bipolar transistor 110, the emitter thereof is connected to the input/output terminal 102, the base thereof is connected to a high-potential power supply terminal 103, and the collector thereof is connected to a low-potential power supply terminal 104. A parasitic diode 107 is arranged between the base and the emitter of the PNP type bipolar transistor 110, and a parasitic resistance 108 is arranged between the base and the high-potential power supply terminal 103.

Referring to FIG. 6, in a region where the PNP type bipolar transistor (110 in FIG. 5) is formed, an N well 235 is formed in a P type semiconductor substrate 201. In the region where the N well 235 is formed, an isolation oxide film 205 having a plurality of openings whose shape is a stripe is formed on the N well 235. On the surface of the N well 235, a high concentration N type base 212 in which high concentration impurities are introduced, a high concentration P type emitter 211, a high concentration P type collector 213, a high concentration P type emitter 211, and a high concentration N type base 212 are formed in this order. The high concentration N type base 212, the high concentration P type emitter 211, and the high concentration P type collector 213 are isolated by the isolation oxide film 205, respectively. The high concentration P type emitter 211 is connected to the input/output terminal 202. The high concentration P type collector 213 is connected to the low-potential power supply wiring 204. The high concentration N type base 212 is connected to the high-potential power supply wiring 203.

In a case of a protection circuit of Conventional Example 1, when a plus ESD surge is applied to the input/output terminal 102 with respect to the low-potential power supply terminal 104, by means of a snap-back operation of the PNP type bipolar transistor 110, current flows from the emitter (high concentration P type emitter 211) connected to the input/output terminal 102, into the collector (high concentration P type collector 213) connected to the low-potential power supply terminal 104, thereby, an internal element 106 is protected by the current. Meanwhile, a minus ESD surge is applied to the input/output terminal 102 with respect to the high-potential power supply terminal 103, by means of a breakdown operation of the parasitic diode 107 of the PNP type bipolar transistor 110, current flows from the emitter (high concentration P type emitter 211) connected to the input/output terminal 102, into the base (high concentration N type base 212) connected to the high-potential power supply terminal 103, thereby, the internal element 106 is protected by the current.

Conventional Example 2

FIG. 7 is an equivalent circuit diagram of a semiconductor device according to Conventional Example 2. FIG. 8 is a partial plan view schematically showing an electrostatic discharge damage protection circuit of the semiconductor device according to Conventional Example 2, and FIG. 9 is a cross-sectional view between B and B' in FIG. 8. In addition, Conventional Example 2 is an example where, for a protection circuit described in the Japanese Patent Laid-Open No. 10-150109, a PNP type bipolar transistor is changed from an NPN type bipolar transistor, so as to be easily compared with Conventional Example 1.

Referring to FIG. 7, a protection circuit (protection element 308) of an input/output terminal 301 connected to an internal circuit 307 is composed of a PNP bipolar transistor. The emitter of the protection element 308 is connected to the input/output terminal 301, and the base and the collector thereof are connected to a high-potential power supply terminal 304. In addition, although not being shown in the figure, a parasitic resistance would be arranged between the base and the high-potential power supply terminal 304.

Referring to FIGS. 8 and 9, in a region in which a protection element (308 in FIG. 7) is formed, an N well 311a is formed in a P substrate 311. In a region in which the N well 311a is formed, a field oxide film 312 having a plurality of square openings arranged in a matrix is formed on the N well 311a. On the surface of the N well 311a in an opening of the field oxide film 312, a P+ diffusion layer 302 in which high concentration impurities are introduced, is formed. In the P+ diffusion layer 302, an emitter 302a is connected to the input/output terminal 301. In the P+ diffusion layer 302, a collector 302b is connected to the high-potential power supply terminal 304. The emitters 302a are arranged in four quarters of each collector 302b, and the collectors 302b are arranged in four quarters of each emitter 302a. The emitters 302a and the collectors 302b are isolated by the field oxide film 312, respectively. In addition, the N well 311a to be a base is connected to the high-potential power supply terminal 304 through an N+ diffusion layer (not shown in the figure).

In a case of the protection circuit of Conventional Example 2, when an minus ESD surge is applied to the input/output terminal 301 with respect to the high-potential power supply terminal 304, by means of breakdown phenomena or punch-through phenomena of the protection element 308, it flows from the emitter 302a connected to the input/output terminal 301 into the base (N well 311a) or the collector 302b connected to the high-potential power supply terminal 304, and, by the current, the internal circuit 307 is protected. Meanwhile, when a plus ESD surge is applied to the input/output terminal 301 with respect to the high-potential power supply terminal 304, by forward direction operation of the parasitic diode between the P+ diffusion layer and the N well of the protection element 308, it flows from the emitter 302a into the base (N well 311a) connected to the high-potential power supply terminal 304, and, by the current, the internal circuit 307 is protected.

Here, differences between Conventional Example 1 and Conventional Example 2 will be described. A first difference is the wiring configuration of the protection circuit. While, in Conventional Example 1, the high concentration P type collector (213 in FIG. 6) of the PNP type bipolar transistor (110 in FIG. 5) is connected to the low-potential power supply wiring (204 in FIG. 6), in Conventional Example 2, the collector (302b in FIG. 9) of the protection element (308 in FIG. 7; a PNP type bipolar transistor) is connected to the high-potential power supply terminal 304 being same as the N well 311a to be a base.

A second difference is the planar configuration of a PNP type bipolar transistor. While, in Conventional Example 1, a plurality of the high concentration P type emitter (211 in FIG. 6) and the high concentration P type collector (213 in FIG. 6) of a PNP type bipolar transistor (110 in FIG. 5) are alternatively arranged in the one direction in a stripe shape, in Conventional Example 2, the emitter (302a in FIG. 9) and the collector (302b in FIG. 9) of the protection element (308 in FIG. 7; PNP type bipolar transistor) are square shaped, the emitters (302a in FIG. 9) are arranged in four quarters of each collector (302b in FIG. 9), and the collectors (302b in FIG. 9) are arranged in four quarters of each emitter (302a in FIG. 9).

A third difference is the action and the effect thereof. In Conventional Example 1, there is a feature in that since, by means of the breakdown operation of the parasitic diode (107 in FIG. 5) of the PNP type bipolar transistor (110 in FIG. 5), the internal element (106 in FIG. 5) is also protected from the ESD surge with respect to a high-potential power supply terminal (103 in FIG. 5), by using single PNP type bipolar transistor (110 in FIG. 5), ESD breakdown with respect to both modes of ESD surge with respect to high-potential power supply terminal (103 in FIG. 5) side and ESD surge with respect to low-potential power supply terminal (104 in FIG. 5) side, can be prevented. Meanwhile, in Conventional Example 2, there is a feature in that there are four directions of passage of current flowing from the emitter (302a in FIG. 9) into the collector (302b in FIG. 9), thereby, the protective element has about twice DES surge drive capability by a same area (DES breakdown can be protected by using the half size protective element (308 in FIG. 7)).

SUMMARY OF THE INVENTION

In case of Conventional Example 1, when a minus DES is applied to the input/output terminal for the high-potential power supply terminal (103 in FIG. 5), the high concentration P type collector (213 in FIG. 6) does not act as a passage through which DES surge flows, discharge by the parasitic diode (107 in FIG. 5) between the high-potential power supply and the input/output terminal also cannot have large current value due to breakdown current of the diode, and the current value being flowable is further limited because a parasitic base (well) resistance is inserted in series, thereby, resulting in a possibility that ESD resistance of the mode will be small. For this reason, in order to address ESD with respect to the high-potential power supply terminal (103 of FIG. 5) basis, it is necessary for the layout size of the protection circuit of the PNP type bipolar transistor (110 in FIG. 5) to be enlarged very much, however, as the results there has been a problem of cost increase due to the enlarged chip size of LSI.

In case of Conventional Example 2, when an ESD surge is input into the input/output terminal (301 in FIG. 7) in a basis of a low-potential power supply (earth; not shown in the figure), since there is no protection circuit to absorb the ESD surge directly between the input/output terminal (301 in FIG. 7) and the low-potential power supply (earth), there has been a problem of weak ESD resistance with respect to the low-potential power supply (earth) basis. For this reason, in order to address DES with respect to the low-potential power supply (earth) basis, a large size of DES protection element will be required between the input/output terminal (301 in FIG. 7) and the low-potential power supply (earth). A DES protection element is added to each input/output terminal (301 in FIG. 7), however, the LSI chip size becomes very large, resulting in an increased cost.

Moreover, in case of Conventional Example 2, there is a zigzag shaped dead space in which a diffusion layer is not formed, at the periphery of a unit of a P+ diffusion layer 302. In this case, in order to enhance the DES resistance, if the layout size of the protection circuit of the PNP type bipolar transistor is enlarged very much, dead space will increase and the chip size of the device will be enlarged, thus resulting in a problem of cost increase.

Moreover, in case of Comparative Example 2, although being not illustrated in a figure, as a device of the wiring layout, a case where layout is performed by forming contact vias on an input wiring 305 and an output wiring 306 respectively connected to the P+ diffusion layer 302, and an top layer wiring connected to the input wiring 305 and the output wiring 306 on the PNP type bipolar transistor, can be considered. However, in this case, since the wiring for the base cannot be formed on the same layer as that of the upper layer wiring connected to the input wiring 305 and the output wiring 306, it will be selected either an arrangement of the wiring for the base outside the range where the PNP type bipolar transistor is formed, or an arrangement of the wiring on a layer upper than the top layer wiring connected to the input wiring 305 and the output wiring 306. In case of arranging the wiring for the base outside the region in which the PNP type bipolar transistor is formed, the wiring for the base to be a passage of the DES surge, is required to have a thick wiring width, thereby, resulting in a problem of large chip size due to the space for the wiring. Moreover, in case of arranging the wiring on the layer upper than the top layer wiring connected to the input wiring 305 and the output wiring 306, as compared to the case of arranging the wiring for the base outside the region in which the PNP type bipolar transistor is formed, total two steps which are a step for forming the wiring on the layer upper than the top layer wiring and a step for forming contact vias, have been added, and production steps have been longer, thus there have been problems of cost increase and increase of production days.

A main problem to be solved of the present invention, is to prevent DES breakdown by using a minimally small DES protection element.

In a first aspect of the present invention, the semiconductor device includes a well formed in a region in which a protection circuit of an input/output terminal is disposed, a plurality of emitter diffusion layers which is formed on the well and whose conductivity is inverse to that of the well; a plurality of first collector diffusion layers which is formed on the well and whose conductivity is inverse to that of the well; a plurality of second collector diffusion layers which is formed on the well and whose conductivity is inverse to that of the well; a base diffusion layer which is formed on the well and whose conductivity is the same as that of the well; an insulating layer which separates the emitter diffusion layers, the first collector diffusion layers, the second collector diffusion layers, and the base diffusion layer, respectively. The emitter diffusion layers, the first collector diffusion layers, and the base diffusion layer constitute a first bipolar transistor; the emitter diffusion layers, the second collector diffusion layers, and the base diffusion layer constitute a second bipolar transistor; the first collector diffusion layers, the second collector diffusion layers, and the base diffusion layer constitute a third bipolar transistor, the emitter diffusion layer is electrically connected to the input/output terminal, the first collector diffusion layers are electrically connected to the low-potential power supply terminal; and the second collector diffusion layers and the base diffusion layer are electrically connected to the high-potential power supply terminal.

In a second aspect of the present invention, the protection circuit includes three types of PNP bipolar transistors. Among the three types of PNP bipolar transistors, in a first PNP type bipolar transistor, the emitter thereof is connected to the input/output terminal, the base thereof is connected to the high-potential power supply terminal, and the collector thereof is connected to the low-potential power supply terminal; in a second PNP type bipolar transistor, the emitter thereof is connected to the input/output terminal, the base and the collector thereof are connected to the high-potential power supply terminal; and, in a third PNP type bipolar transistor, the emitter thereof is connected to the low-potential power supply terminal, and the base and the collector thereof are connected to the high-potential power supply terminal.

According to the present invention, a high ESD resistance ESD protection device can be achieved without enlarging the layout size of a protection circuit. Moreover, since a sufficient protection function can be achieved with respect to all ESD modes by only using the circuit, an additional protection circuit is not required. Consequently, lower cost (chip size shrink) and high reliability can be achieved.

BRIEF DESCRIPTION OF THE DRAWINGS

FIG. 6 (b) is a cross-sectional view between A and A' schematically illustrating the electrostatic discharge damage protection circuit of the semiconductor device according to Conventional Example 1;

DETAILED DESCRIPTION OF THE PREFERRED EMBODIMENTS

Embodiment 1

Figure 1:
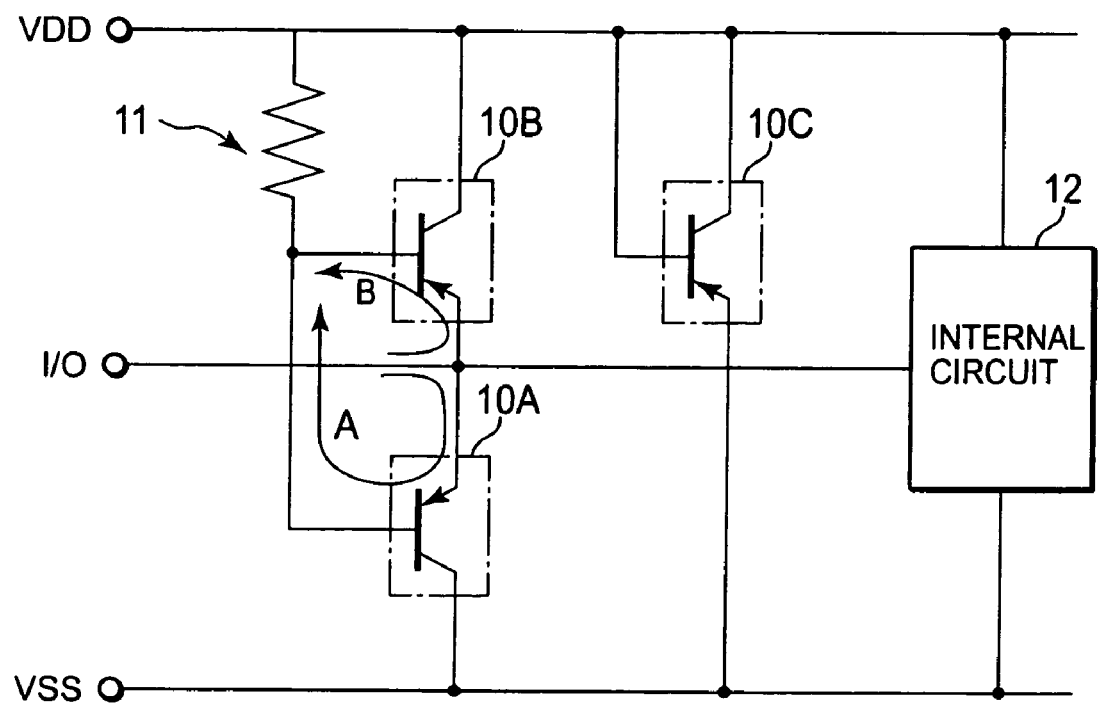
FIG. 1 is an equivalent circuit diagram schematically illustrating a protection circuit of a semiconductor device according to Embodiment 1 of the present invention.
Figure 2:
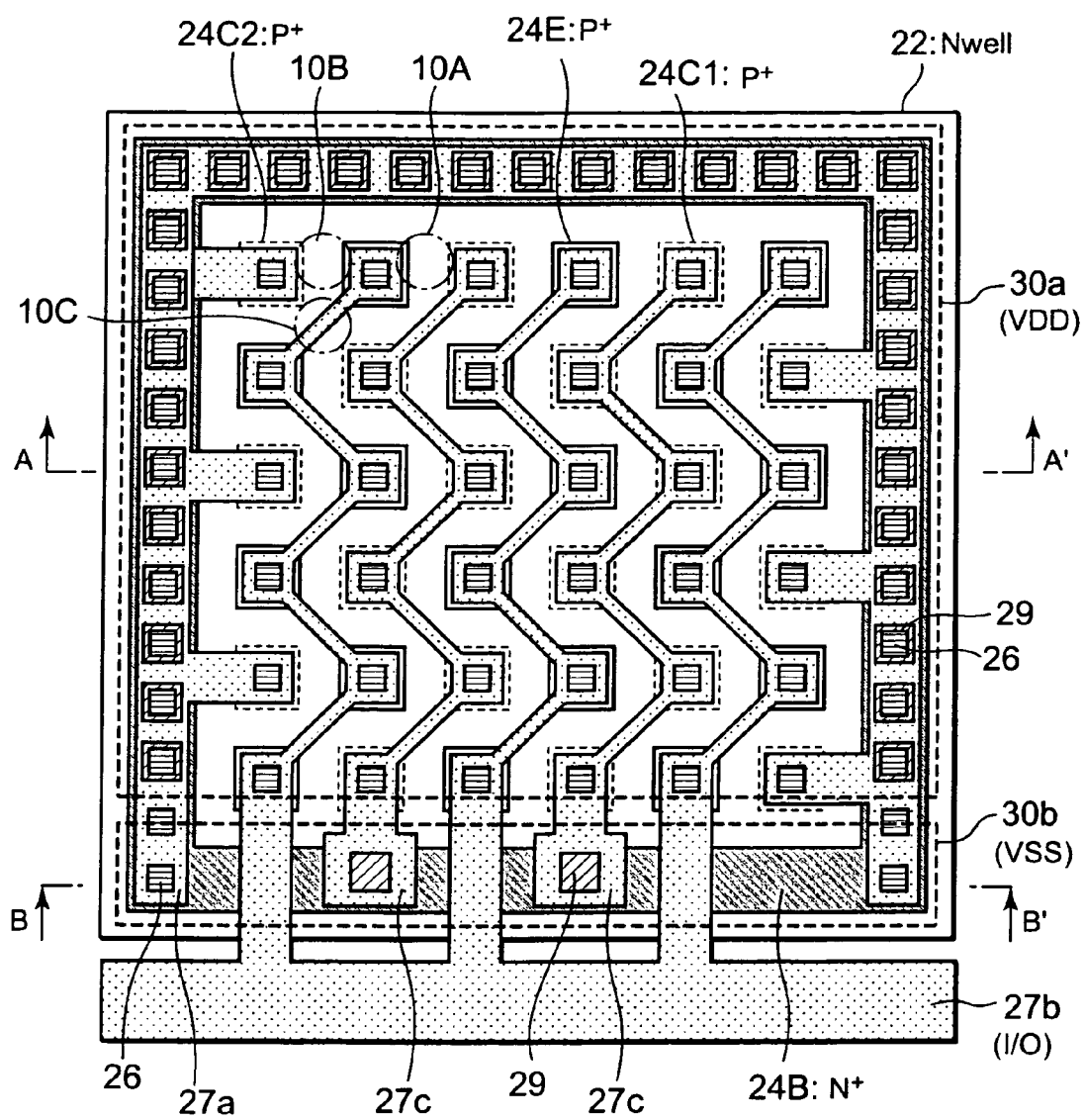
FIG. 2 is a plan view illustrating a configuration of the protection circuit of the semiconductor device according to Embodiment 1 of the present invention.
Figure 3:
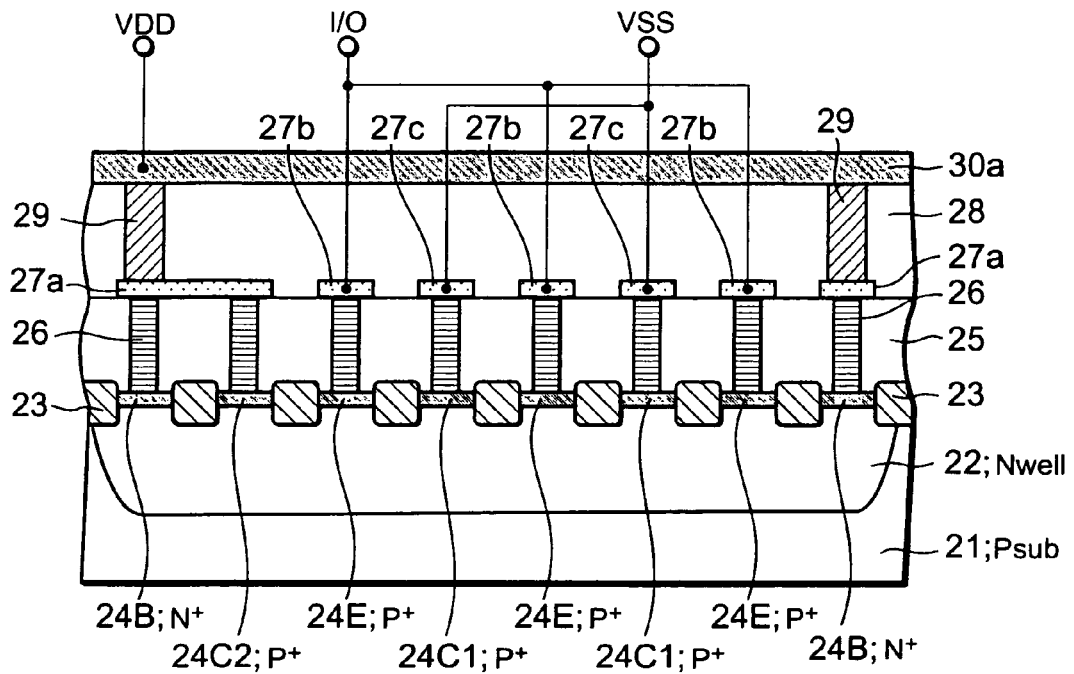
FIG. 3 is a cross-sectional view between A and A' in FIG. 2, illustrating a configuration of the protection circuit of the semiconductor device according to Embodiment 1 of the present invention.

Next, a semiconductor device according to Embodiment 1 will be described with reference to drawings. FIG. 1 is an equivalent circuit diagram schematically illustrating a protection circuit of a semiconductor device according to Embodiment 1 of the present invention. FIG. 2 is a plan view illustrating the configuration of the protection circuit of the semiconductor device according to Embodiment 1 of the present invention. FIG. 3 is a cross sectional view between A and A' in FIG. 2 illustrating the configuration of the protection circuit of the semiconductor device according to Embodiment 1 of the present invention. And FIG. 4 is a cross sectional view between B and B' in FIG. 2 illustrating the configuration of the protection circuit of the semiconductor device according to Embodiment 1 of the present invention.

Referring to FIG. 1, the protection circuit of an input/output terminal I/O is composed of three types of PNP bipolar transistors, namely, a first PNP type bipolar transistor 10A, a second PNP type bipolar transistor 10B, and a third PNP type bipolar transistor 10C. The first PNP type bipolar transistor 10A and the second PNP type bipolar transistor 10B are configured in a ratio of nA to nB (a ratio of 4 to 1 in FIG. 2). In the first PNP type bipolar transistor 10A, the emitter (E) thereof is connected to the input/output terminal I/O, the base (B) thereof is connected to the high-potential power supply terminal VDD, and the collector (C) thereof is connected to the low-potential power supply terminal VSS. In the second PNP type bipolar transistor 10B, the emitter (E) thereof is connected to the input/output terminal I/O, and the base (B) and the collector (C) thereof are connected to the high-potential power supply terminal VDD. In the third PNP type bipolar transistor 10C, the emitter (E) thereof is connected to the low-potential power supply terminal VSS, and the base (B) and the collector (C) thereof are connected to the high-potential power supply terminal VDD. A parasitic resistance 11 is present on a wiring between the bases (B) of the PNP bipolar transistors 10A and 10B, and the high-potential power supply terminal VDD. An internal circuit 12 is connected to the input/output terminal I/O, the high-potential power supply terminal VDD, and the low-potential power supply terminal VSS, respectively.

Figure 4:
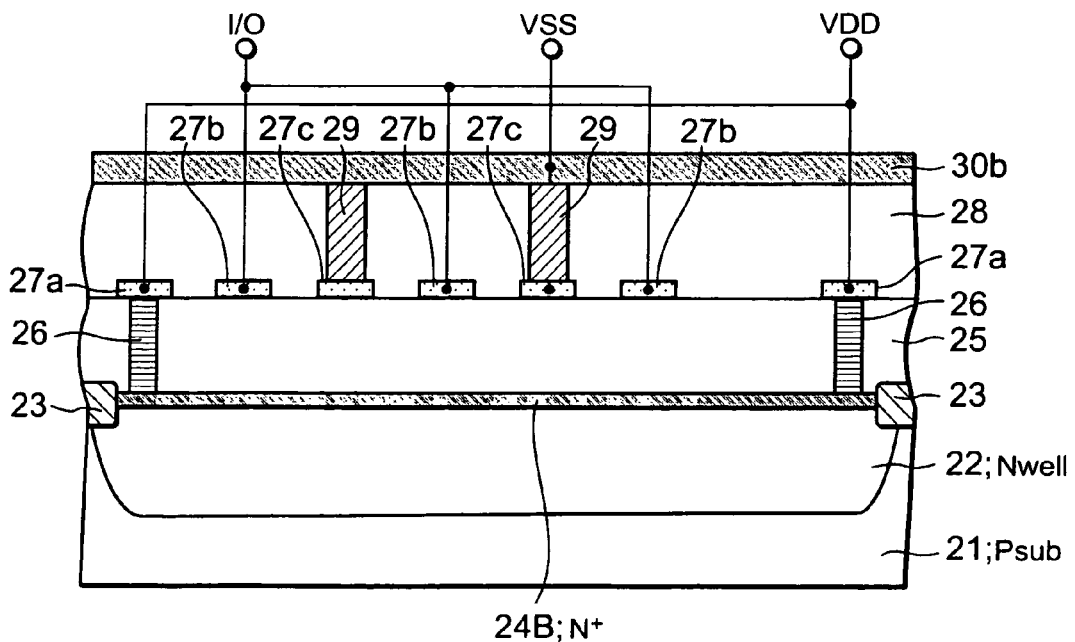
FIG. 4 is a cross-sectional view between B and B' in FIG. 2, illustrating a configuration of the protection circuit of the semiconductor device according to Embodiment 1 of the present invention.
Figure 5:
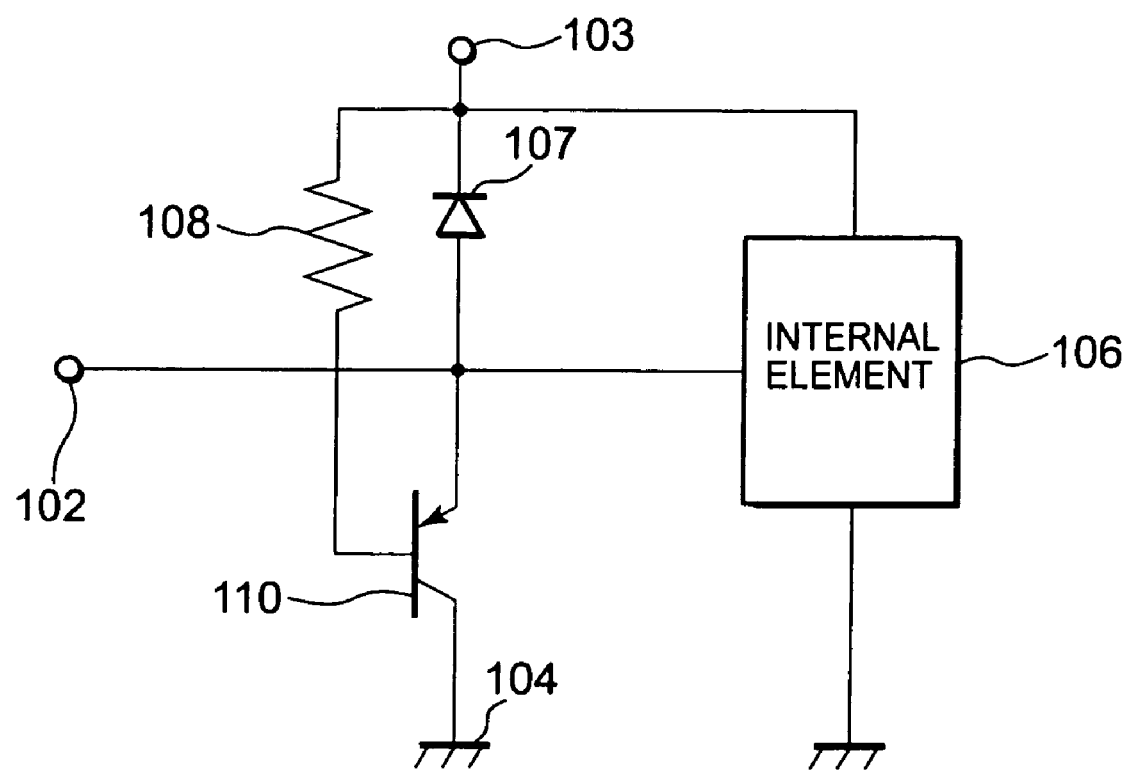
FIG. 5 is an equivalent circuit diagram schematically illustrating an electrostatic discharge damage protection circuit of a semiconductor device according to Conventional Example 1.
Figure 6A:
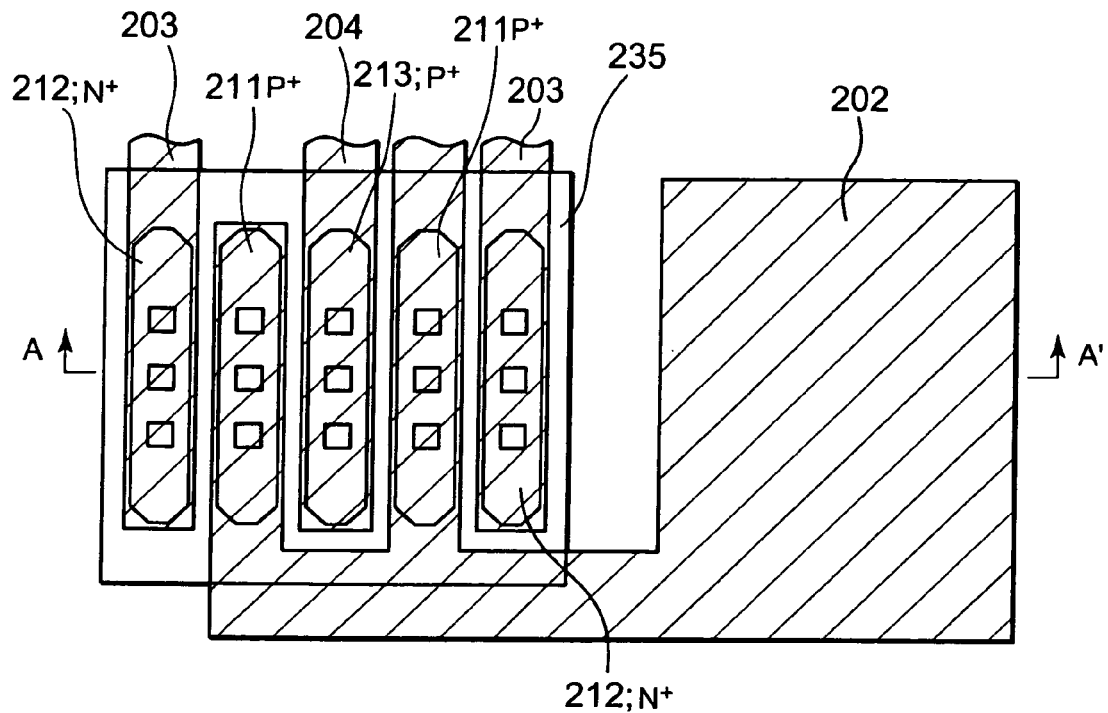
FIG. 6 (a) is a partial plan view schematically illustrating the electrostatic discharge damage protection circuit of the semiconductor device according to Conventional Example 1.
Figure 6B:
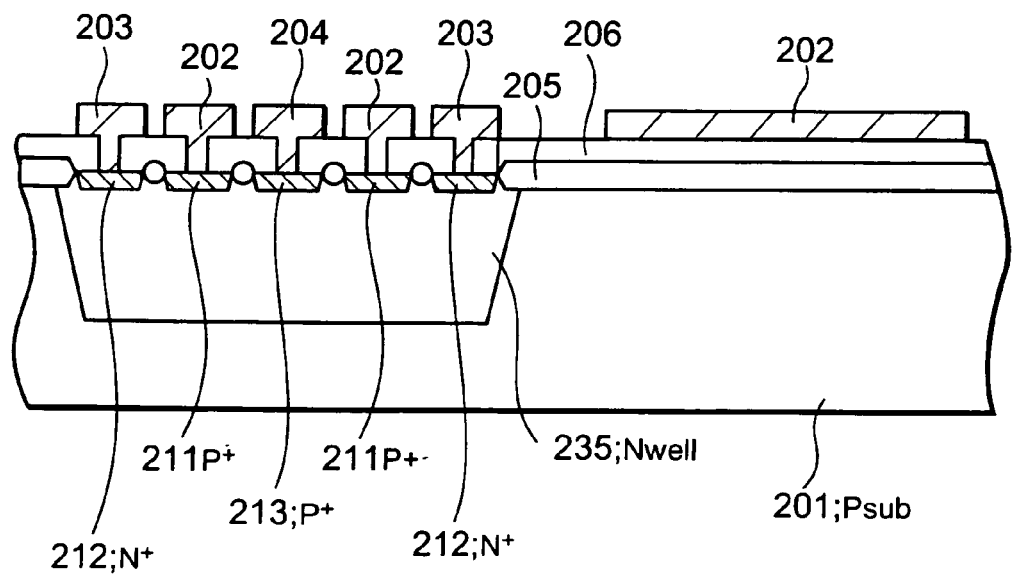
Figure 7:
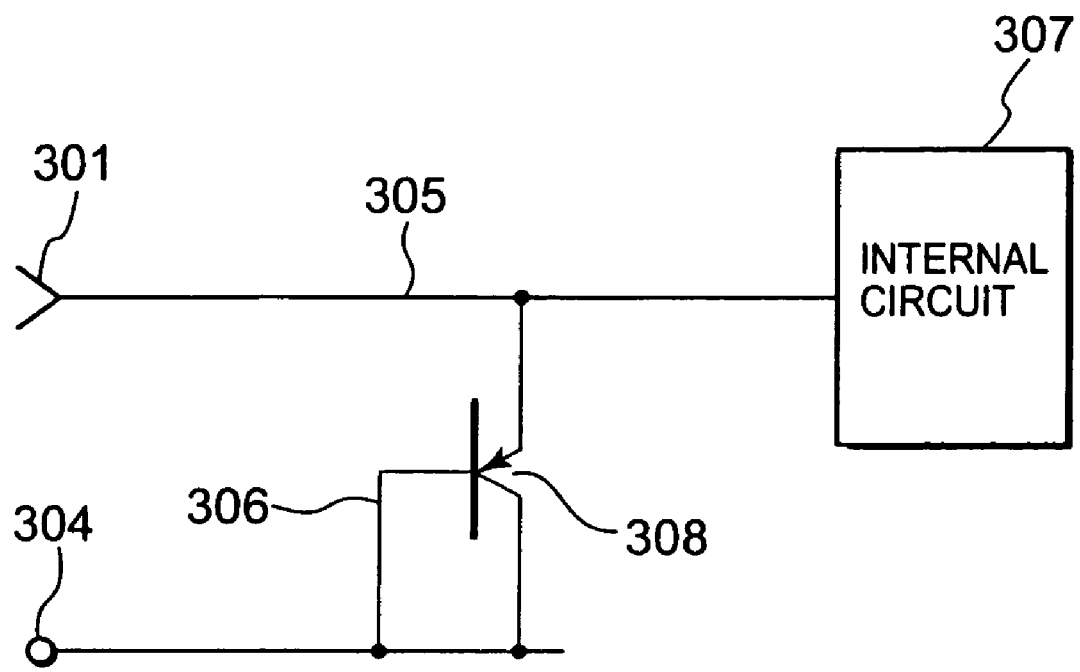
FIG. 7 is an equivalent circuit diagram schematically illustrating an electrostatic discharge damage protection circuit of a semiconductor device according to Conventional Example 2.
Figure 8:
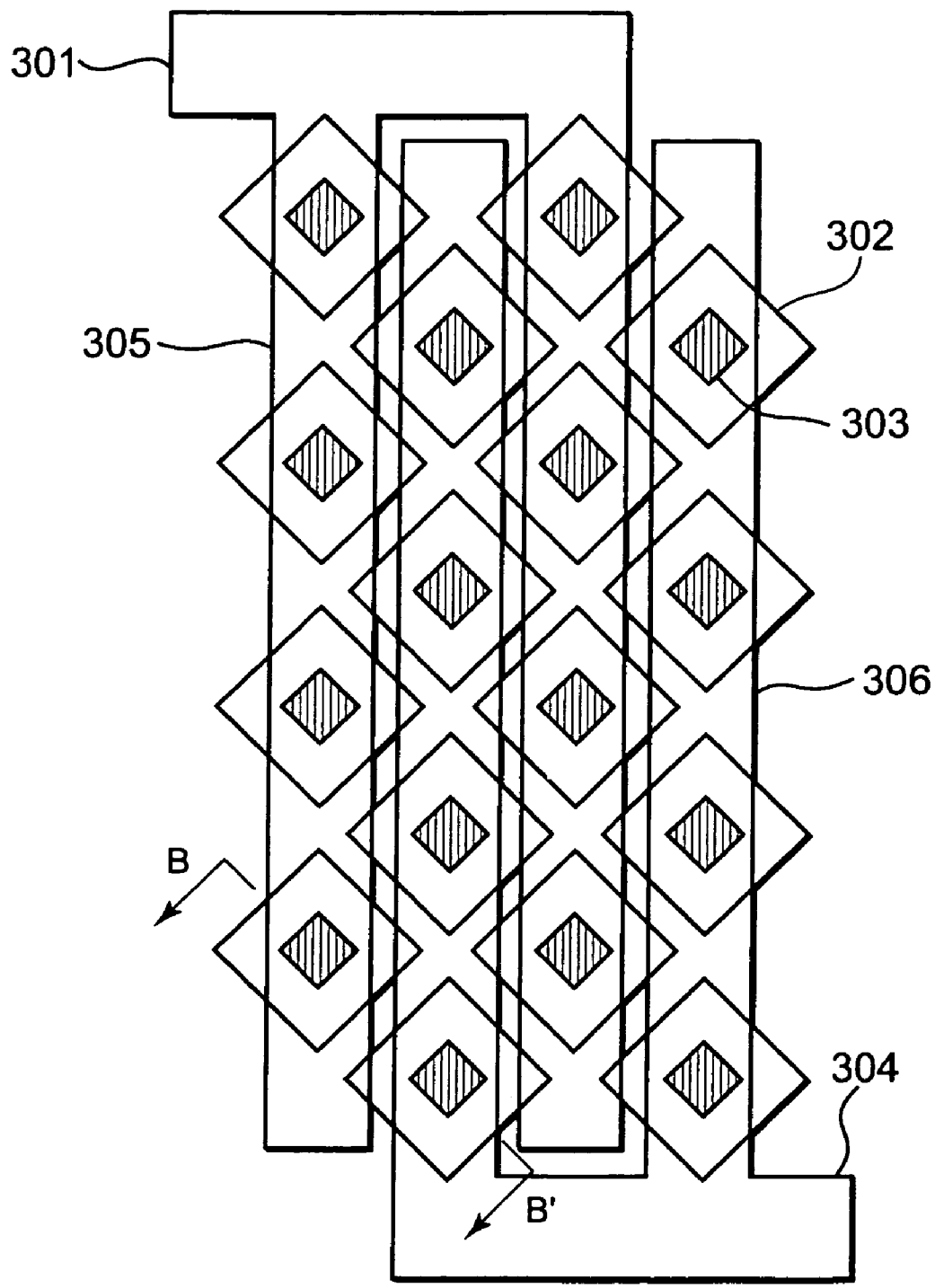
FIG. 8 is a partial plan view schematically illustrating the electrostatic discharge damage protection circuit of the semiconductor device according to Conventional Example 2.
Figure 9:
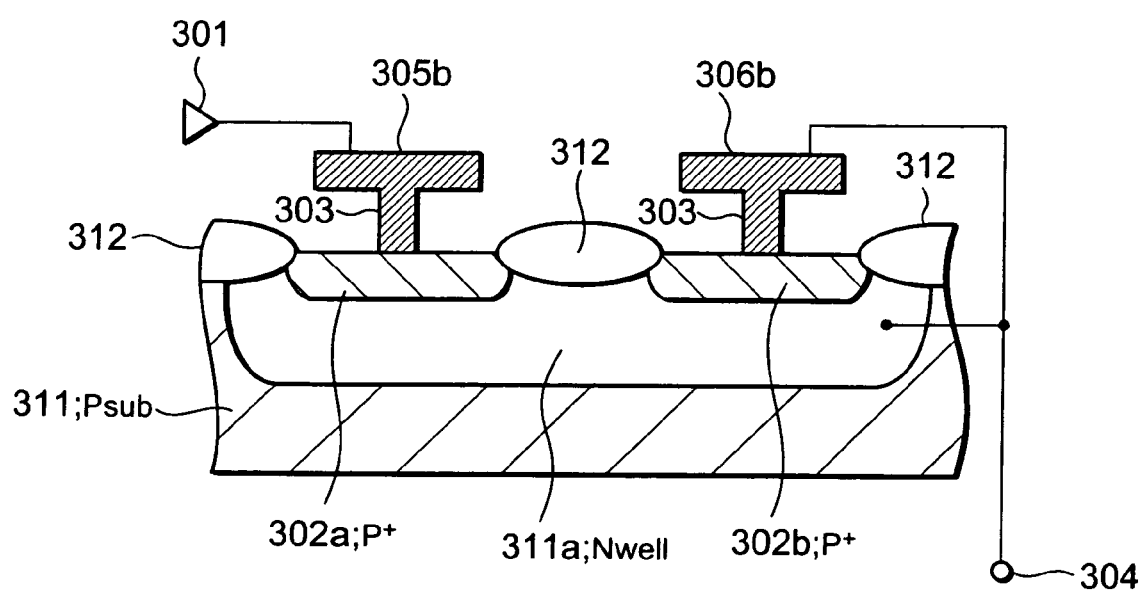
FIG. 9 is a cross-sectional view between B and B' in FIG. 8, illustrating the electrostatic discharge damage protection circuit of the semiconductor device according to Conventional Example 2 of the present invention.

Referring to FIGS. 2 to 4, an N well 22 is formed in a P type semiconductor substrate 21 in a region where the PNP bipolar transistors 10A, 10B, and 10C are formed. An isolation insulating film 23 is formed on the region where the N well 22 is formed. The isolation insulating film 23 includes a plurality of dot shaped (square shaped in FIG. 2) first openings (portions in which P+ diffusion layers 24C1, 24C2, and 24E are formed, respectively) making a matrix on the N well 22, a plurality of second stripe shaped (frame shaped) openings (portions in which an N+ diffusion layer 24B is formed) which are arranged to surround the first openings. On the surface of the N well 22 in the first openings of the isolation insulating film 23, the P+ diffusion layers 24C1, 24C2, and 24E are formed, in which high concentration P type impurities are introduced.

The P+ diffusion layers 24E and the P+ diffusion layers 24C1 are alternatively arranged in a row direction and a column direction. As for P+ diffusion layers 24C2, they are arranged so that one layer is present in each row, at the left end in odd rows in FIG. 2, and at the right end in even rows in FIG. 2, and so as to be adjacent to the P+ diffusion layer 24E. The P+ diffusion layers 24E are arranged in four quarters of the P+ diffusion layers 24C1 except for the periphery, and the P+ diffusion layers 24C1 are arranged in four quarters of the P+ diffusion layers 24E except for the periphery. The P+ diffusion layers 24E become emitters, and the P+ diffusion layers 24C1 and 24C2 become collectors. On the surfaces of the N well 22 in the second openings of the isolation insulating film 23, N+ diffusion layers 24B are formed, in which high concentration N type impurities are introduced. The N+ diffusion layers 24B became bases.

The P+ diffusion layer 24E, the P+ diffusion layers 24C1 and 24C2, and the N+ diffusion layer 24B are isolated by the isolation insulating film 23, respectively. The P+ diffusion layer 24E is electrically connected to a wiring 27b connected to the input/output terminal I/O, through a contact plug 26. In the P+ diffusion layers 24C1 and 24C2, there are a P+ diffusion layer 24C1 electrically connected to a wiring 27c through the contact plug 26 and a P+ diffusion layer 24C2 electrically connected to a wiring 27a through the contact plug 26. The P+ diffusion layer 24C1 is electrically connected to the low-potential power supply terminal VSS through the contact plug 26, the wiring 27c, a contact via 29, and a wiring 30b. The P+ diffusion layer 24C2 is electrically connected to the high-potential power supply terminal VDD through the contact plug 26, the wiring 27a, the contact via 29, and a wiring 30a. The ratio between the numbers of the P+ diffusion layers 24C1 and the P+ diffusion layers 24C2 is 3 to 1 in FIG. 2. The N+ diffusion layer 24B is electrically connected to the high-potential power supply terminal VDD through the contact plug 26, the wiring 27a, the contact via 29, and the wiring 30a.

On the isolation insulating film 23 including the P+ diffusion layer 24E, the P+ diffusion layers 24C1 and 24C2, and the N+ diffusion layer 24B, an interlayer insulating film 25 is formed. In the interlayer insulating film 25, prepared holes communicating with the P+ diffusion layer 24E, the P+ diffusion layers 24C1 and 24C2, and the N+ diffusion layer 24B, respectively, are formed. In the prepared hole of the interlayer insulating film 25, the contact plug 26 made of tungsten etc. is buried. The wirings 27a, 27b, and 27c are formed at predetermined positions on the interlayer insulation film 25 including the contact plug 26. The wiring 27a is electrically connected to the P+ diffusion layer 24C2 and the N+ diffusion layer 24B through the contact plug 26, and to the wiring 30a connected to the high-potential power supply terminal VDD through the contact via 29. The wiring 27b is electrically connected to the P+ diffusion layer 24E through the contact plug 26, and connected to the input/output terminal I/O. The wiring 27c is electrically connected to the P+ diffusion layer 24C1 through the contact plug 26, and to the wiring 30b connected to the low-potential power supply terminal VSS through the contact via 29.

On the interlayer insulating film 25 including the wirings 27a, 27b and 27c, an interlayer insulating film 28 is formed. In the interlayer insulating film 28, prepared holes communicating with the wirings 27a, 27b and 27c, respectively, are formed. In the prepared holes of the interlayer insulation film 28, the contact vias 29 made of tungsten etc. are buried. The wiring 30a and 30b are formed at the predetermined positions on the interlayer insulation film 28 including the contact vias 29. The wiring 30a is electrically connected to the wiring 27a through the contact via 29, and connected to the high-potential power supply terminal VDD. The wiring 30b is electrically connected to the wiring 27c through the contact via 29, and connected to the low-potential power supply terminal VSS.

Here, the P+ diffusion layer 24C1 (collector), the N+ diffusion layer 24B (base), and the P+ diffusion layer 24E (emitter) constitute the first PNP type bipolar transistor 10A. The P+ diffusion layer 24C2 (collector), the N+ diffusion layer 24B (base), and P+ diffusion layer 24E (emitter) constitute the second PNP type bipolar transistor 10B. The P+ diffusion layer 24C1 (emitter), the N+ diffusion layer 24B (base), and the P+ diffusion layer 24C2 (collector) constitute the third PNP type bipolar transistor 10C. In addition, although the P+ diffusion layer 24C1 functions as the collector in the first PNP type bipolar transistor 10A, it functions as the emitter in the third PNP type bipolar transistor 10C.

As mentioned above, the three types of PNP bipolar transistors which contact different components 10A, 10B and 10C, are formed in one N well 22 region.

Next, the operation of the semiconductor device according to Embodiment 1 of the present invention will be described.

In case of Embodiment 1, when a plus ESD surge is applied to the input/output terminal I/O with respect to the low-potential power supply terminal VSS, by the snap-back operation of the first PNP type bipolar transistor 10A, surge current flows from the P+ diffusion layer 24E (emitter) connected to the input/output terminal I/O into the P+ diffusion layer 24C1 (collector) connected to the low-potential power supply terminal VSS. By the flow of the surge current through the first PNP type bipolar transistor 10A, an internal circuit 12 will be protected.

Meanwhile, when a minus ESD surge is applied to the input/output terminal I/O with respect to the low-potential power supply terminal VSS, by the snap-back operation of the first PNP type bipolar transistor 10A, minus surge current flows from the P+ diffusion layer 24E (emitter) connected to the input/output terminal I/O into the P+ diffusion layer 24C1 (collector) connected to the low-potential power supply terminal VSS. By the flow of the surge current through the first PNP type bipolar transistor 10A, the internal circuit 12 will be protected.

Next, when a plus ESD surge is applied to the input/output terminal I/O with respect to the high-potential power supply terminal VDD, forward direction current flows from the P+ diffusion layer 24E (emitter) in the second PNP type bipolar transistor 10B to the N well, and by a common operation of a bipolar transistor, surge current flows from the P+ diffusion layer 24E (emitter) into the P+ diffusion layer 24C2 (collector) connected to the high-potential power supply terminal VDD. By the flow of the surge current through the second PNP type bipolar transistor 10B, the internal circuit 12 will be protected.

Meanwhile, when a minus ESD surge is applied to the input/output terminal I/O with respect to the high-potential power supply terminal VDD, by the breakdown operation of a parasitic diode (not illustrated in the figure) formed between the P+ diffusion layer in the first PNP type bipolar transistor 10A and the N well, minus surge current flows from the P+ diffusion layer 24E (emitter) connected to the input/output terminal I/O into the N+ diffusion layer 24B (base) connected to the high-potential power supply terminal VDD (see current passage A in FIG. 1). At the same time, by the breakdown operation of a parasitic diode (not illustrated in the figure) formed between the P+ diffusion layer in the second PNP type bipolar transistor 10B and the N well, minus surge current flows from the P+ diffusion layer 24E (emitter) into the P+ diffusion layer 24C2 (collector) and the N+ diffusion layer 24B (base) connected to the high-potential power supply terminal VDD (see current passage B in FIG. 1). By the flow of the surge current through both of the current passage A of the first PNP type bipolar transistor 10A and the current passage B of the second PNP type bipolar transistor 10B, the internal circuit 12 will be protected.

Moreover, when a plus ESD surge is applied to the high-potential power supply terminal VDD with respect to the low-potential power supply terminal VSS, by the breakdown operation of the junction between the P+ diffusion layer 24C2 (collector) of the third PNP type bipolar transistor 10C and the N well 22, and by the snap-back operation flowing from the P+ diffusion layer 24C2 (collector) to the P+ diffusion layer 24C1 (collector), surge current flows into the low-potential power supply terminal VSS. By the flow of the surge current through the third PNP type bipolar transistor 10C, the internal circuit 12 will be protected.

Further, when a minus ESD surge is applied to the high-potential power supply terminal VDD with respect to the low-potential power supply terminal VSS, by the forward direction operation of the junction between the P+ diffusion layer 24C2 (collector) of the third PNP type bipolar transistor 10C and the N well 22, the third PNP type bipolar transistor 10C turns to be on, and by the flow of the surge current from the P+ diffusion layer 24C2 (collector) to the P+ diffusion layer 24C1 (collector), the internal circuit 12 will be protected.

As mentioned above, since it is possible to perform the ESD protection with respect to a DES surge between VDD and VSS, without using a parasitic diode separated from the power supply, such as a common CMOS device, it is also possible for a device whose structure does not have the parasitic diode between the power supplies, such as an SOI (Silicon on Insulator) to achieve the ESD protection between the power supplies.

As mentioned above, in Embodiment 1, the DES protection function is provided with respect to all DES modes.

According to Embodiment 1, by providing the second PNP type bipolar transistor 10B also between the high-potential power supply terminal VDD and the input/output terminal I/O, where DES resistance has been weak as in Conventional Example 1, the surge current also flows through the current passage B in parallel, thereby, without enlarging the layout size of the protection circuit, enabling a DES protection device with high DES resistance to be achieved.

Moreover, by connecting the P+ diffusion layer 24C2 (collector) which had not contributed to ESD protection as in Conventional Example 2 to the N+ diffusion layer 24B (base) so as to provide an ESD protection function as the second PNP type bipolar transistor 10B, it is possible to achieve a DES protection device with high DES resistance by using a small size DES protection circuit (one PNP type bipolar transistor).

Moreover, in Conventional Example 1, the DES protection with respect to the high-potential power supply terminal VDD, is not sufficient, and in Conventional Example 2, the DES protection with respect to the low-potential power supply terminal VSS, is not present, thereby, another new DES protection circuit has been required. However, in Embodiment 1, since the third PNP type bipolar transistor 10C contributing for power supply protection is built into the input-and-output protection circuit of each input/output terminal, reduction of the layout size of the power supply protection circuit can be achieved, or a new power supply protection circuit can be made unnecessary.

Moreover, in a configuration ratio of nA to nB, the first PNP bipolar transistors 10A protecting between the input/output terminal I/O and the low-potential power supply terminal VSS, and between the input/output terminal I/O and the high-potential power supply terminal VDD, and the second PNP bipolar transistors 10B protecting between the input/output terminal I/O and the high-potential power supply terminal VDD, are combined and configured, thereby, when the DES resistance between the input/output terminal I/O and the low-potential power supply terminal VSS, by increasing the configuration ratio of nA, and when the DES resistance between the input/output terminal I/O and the high-potential power supply terminal VDD, by increasing the configuration ratio of nB, it is possible to achieve a DES protection device with high DES resistance, which is optimum for the DES surge. In addition, since the layout change of the configuration ratio of nA to nB can be achieved by changing the layout subsequent to the wirings 27a, 27b and 27c, design change for the purpose of improving the DES resistance can be achieved simply and in a short time.

Further, by constituting three types of PNP bipolar transistors which connect different components using PNP bipolar transistors of one region, without enlarging the layout size of an input protection circuit, and by providing a function for protection of power supply to the input protection circuit, without adding a new power supply protection, it is possible to achieve a DES protection circuit with high DES resistance, thus, enabling lower cost (chip size shrink) and high reliability to be achieved.

What is claimed is:

1. A protection circuit comprising, wherein
    a first PNP type bipolar transistor including an emitter thereof connected to an input/output terminal, a collector thereof connected to a first power supply terminal, and a base thereof connected to a second power supply terminal,
    a second PNP type bipolar transistor including an emitter thereof connected to the input/output terminal, and a base and collector thereof connected to the second power supply terminal, and
    a third PNP type bipolar transistor including an emitter thereof connected to the first power supply terminal, and a base and collector thereof connected to the second power supply terminal.

2. The protection circuit according to claim 1, wherein said first power supply terminal comprises a low potential power supply terminal and said second power supply terminal comprises a high potential power supply terminal.

* * * * *